United States Patent [19]
Yuuki et al.

[11] Patent Number: 5,669,976
[45] Date of Patent: Sep. 23, 1997

[54] CVD METHOD AND APPARATUS THEREFOR

[75] Inventors: Akimasa Yuuki; Takaaki Kawahara; Kouitirou Tsutahara; Touru Yamaguchi, all of Hyogo, Japan

[73] Assignee: Mitsubishi Denki Kabushiki Kaisha, Tokyo, Japan

[21] Appl. No.: 201,154

[22] Filed: Feb. 24, 1994

Related U.S. Application Data

[63] Continuation of Ser. No. 806,892, Dec. 16, 1991, abandoned.

[30] Foreign Application Priority Data

Dec. 28, 1990 [JP] Japan ................. 2-408754
Mar. 20, 1991 [JP] Japan ................. 3-016793 U
Jul. 1, 1991 [JP] Japan ................. 3-160349

[51] Int. Cl.$^6$ ............................................ C23C 16/00
[52] U.S. Cl. ........................................ 118/725; 118/715
[58] Field of Search ........................... 118/715, 725

[56] References Cited

U.S. PATENT DOCUMENTS

| | | | |
|---|---|---|---|
| 3,854,443 | 12/1974 | Baerg | 118/730 |
| 4,625,678 | 12/1986 | Shioya | 118/725 |
| 4,771,730 | 9/1988 | Tezuka | 118/725 |
| 4,989,541 | 2/1991 | Mikoshiba | 118/715 |
| 4,993,358 | 2/1991 | Mahawili | 118/715 |
| 5,000,113 | 3/1991 | Wang | 118/729 |

FOREIGN PATENT DOCUMENTS

| | | | |
|---|---|---|---|
| 53-54181 | 5/1978 | Japan | 118/715 |
| 61-064122 | 4/1986 | Japan | 118/715 |
| 61-189624 | 8/1986 | Japan | 118/725 |
| 63-053932 | 3/1988 | Japan | 118/715 |
| 1-223724 | 9/1989 | Japan . | |
| 1-286306 | 11/1989 | Japan | 118/715 |
| 2-200784 | 8/1990 | Japan . | |
| 2-234419 | 9/1990 | Japan | 118/723 |
| 2-283696 | 11/1990 | Japan . | |
| 2-271627 | 11/1990 | Japan . | |
| 2-142525 | 12/1990 | Japan . | |
| 3-281780 | 12/1991 | Japan | 118/715 |

OTHER PUBLICATIONS

Webster's New Collegiate Dictionary ©1975, G&C Merriam Co., Springfield, Mass. p. 853.

*Primary Examiner*—Richard Bueker
*Attorney, Agent, or Firm*—Lowe, Price, LeBlanc & Becker

[57] ABSTRACT

A CVD method including the steps of: setting a semiconductor wafer on a heating stage within a CVD reaction chamber; and emitting CVD reaction gas towards at least the central major region of the wafer from a first gas blowing region of a gas head provided opposing the wafer and having a plurality of gas blowing regions separated from each other, and simultaneously emitting inert gas towards the peripheral region of the wafer from a second gas blowing region of the gas head, while maintaining the temperature of the wafer at a predetermined temperature, and while maintaining the pressure of the CVD reaction chamber within a range from 100 Torr to atmospheric pressure; whereby a CVD film of high quality can be formed in uniform thickness on the wafer, and the consumed amount of reaction gas and the amount of undesirable precipitated particles can be reduced.

8 Claims, 13 Drawing Sheets

CVD METHOD AND APPARATUS THEREFOR

This application is a continuation of application Ser. No. 07/806,892 filed Dec. 16,1991 now abandoned.

BACKGROUND OF THE INVENTION

1. Field of the Invention

The present invention relates to a CVD (Chemical Vapor Deposition) method and an apparatus therefor, and more particularly, to an improvement of a CVD method suitable for forming a thin film on a semiconductor wafer and an apparatus therefor.

2. Description of the Background Art

A sectional view of a CVD apparatus disclosed in Japanese Patent Laying-Open No. 2-283696 is shown in FIG. 1. This CVD apparatus comprises a heating stage for holding a semiconductor wafer 1 upon which a CVD film (not shown) is to be formed; a heater 3 for heating stage 2; a reaction chamber 4 in which semiconductor wafer 1 is to be processed by CVD; a gas head 5 having a plurality of gas blowing openings 6 and provided opposing stage 2 with a distance therebetween for supplying reaction gas A; a reaction chamber sidewall 7 surrounding reaction chamber 4; an exhaust gas ring 8; an exhaust gas chamber 9; an exhaust path 10 provided in the proximity of reaction chamber sidewall 7 for passing exhaust C; an exhaust outlet 11; an exhaust flange 12; a stage clearance 14 for preventing heat dissipation of stage 2 due to conduction and for allowing rotation of stage 2; an $N_2$ blowing opening 15; and an $N_2$ blowing ring 16.

A CVD apparatus of the above-described structure can form a CVD film on semiconductor wafer 1 by directing reaction gas A from gas blowing openings 6 towards semiconductor wafer 1 previously heated upon stage 2. The growth rate of the CVD film depends upon the gas concentration supplied from gas head 5 to semiconductor wafer 1. It is therefore necessary to maintain the reaction gas A flow in a stable and uniform manner so that the concentration of reaction gas A is stable and uniform at an arbitrary portion above semiconductor wafer 1 in order to obtain a uniform thickness of a CVD film.

Reaction gas A generates undesirable precipitated particles by CVD reaction which adhere to some portions on the reaction chamber's inside wall. Precipitated particles D afterwards fall off from the inside wall to adhere to semiconductor wafer 1. Precipitated particles D are responsible for decrease in product yield. If the reaction chamber was frequently cleaned for removing precipitated particles D to avoid decrease in yield, the productivity was lowered. There is the need of decreasing generation of precipitated particles and to discharge the generated particles D from reaction chamber 4 along with exhausted C.

The major portion of a continuous type CVD apparatus of prior art is shown in FIG. 2. An enlarged sectional view of the gas head portion of the CVD apparatus of FIG. 2 is shown in FIG. 3. This continuous type CVD apparatus comprises a stage 2 for transporting a plurality of semiconductor wafers 1 on which a CVD film (not shown) is to be formed; a heater 3 for heating stage 2 and semiconductor wafer 1 mounted thereupon to a predetermined temperature; a plurality of gas heads 5 having a plurality of slits all over and opposing semiconductor wafer 1 for supplying reaction gas A in a uniform manner to semiconductor wafer 1; and an exhaust cover 20 provided to cover the plurality of gas heads 5 for gathering exhaust C.

In the conventional continuous type CVD apparatus of the above-described structure, reaction gas A supplied from the end of gas head 5 towards semiconductor wafer 1 spreads out horizontally to flow out as exhaust C without reaching semiconductor wafer 1. Reaction gas A not reaching wafer 1 generates by CVD reaction undesirable precipitated particles D which adhere to the outside wall of gas head 5, the inner sidewall of exhaust cover 20 and the like. These precipitated particles D fall off to adhere to semiconductor wafer 1, resulting in decrease in product yield. It is necessary to periodically stop the apparatus to remove precipitated particles D. This is responsible for reduction of operating efficiency of the apparatus.

SUMMARY OF THE INVENTION

In view of the foregoing, an object of the present invention is to provide a CVD method for efficiently forming a CVD film of uniform thickness and of good quality, and an apparatus therefor.

Another object of the present invention is to provide a CVD method that can have the used amount of reaction gas reduced, and an apparatus therefor.

A CVD method according to an aspect of the present invention includes the steps of: setting a semiconductor wafer on a heating stage within a CVD reaction chamber, and blowing CVD reaction gas from a first gas blowing region of a gas head arranged opposing the wafer and having a plurality of gas blowing regions separated from each other towards at least the central main region of the wafer simultaneously, and blowing an inert gas from second gas blowing region of the gas head towards a region of a peripheral part of the wafer, while maintaining the temperature of the wafer at a predetermined temperature and maintaining the pressure of the CVD reaction chamber within a range of 100 Torr to atmospheric pressure, to form a CVD film of high quality and of uniform thickness on the wafer, as well as to reduce the consumed amount, of reaction gas and the amount of undesirable precipitated particles D.

A CVD apparatus according to a further aspect of the present invention includes: a CVD reaction chamber where the pressure therein is maintained within a range of 100 Torr to atmospheric pressure; a heating stage for holding a semiconductor wafer set thereupon at a predetermined temperature in the reaction chamber; a gas head provided opposing the wafer for emitting gas towards the wafer, wherein the gas head includes a first gas blowing region for emitting CVD reaction gas towards at least the central major region of the wafer, and a second gas blowing region for emitting inert gas towards the peripheral region of the wafer, the first and second gas blowing regions being in a common plane apart from said wafer by a predetermined distance, whereby a CVD film of high quality can be formed in uniform thickness on the wafer, and the consumed amount of reaction gas and the amount of undesirable precipitated particles can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the drawings, like reference characters designate equivalent or corresponding parts.

DESCRIPTION OF THE PREFERRED EMBODIMENTS

Figure 1:
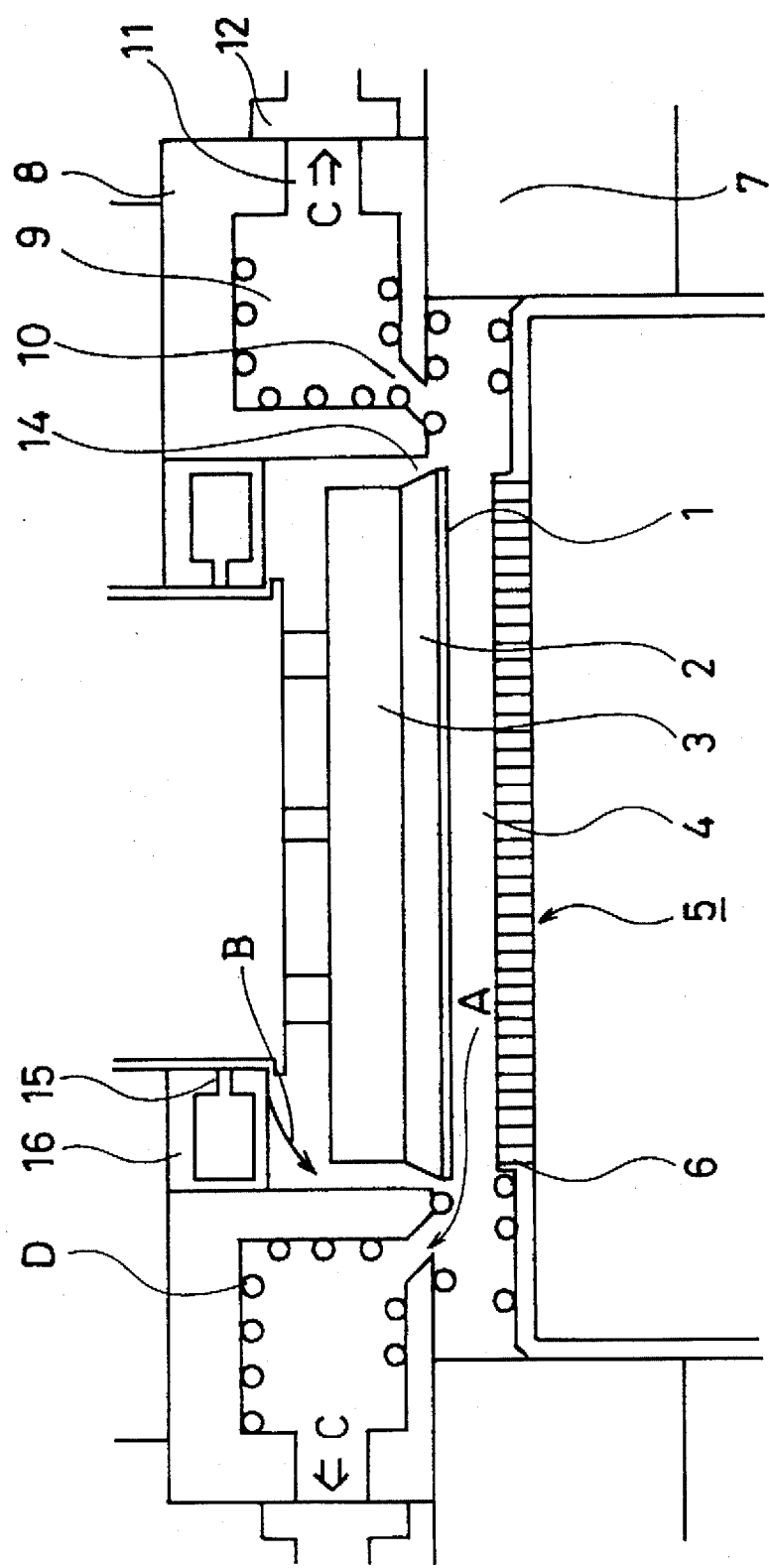
FIG. 1 is a sectional view of a conventional CVB apparatus.
Figure 4:
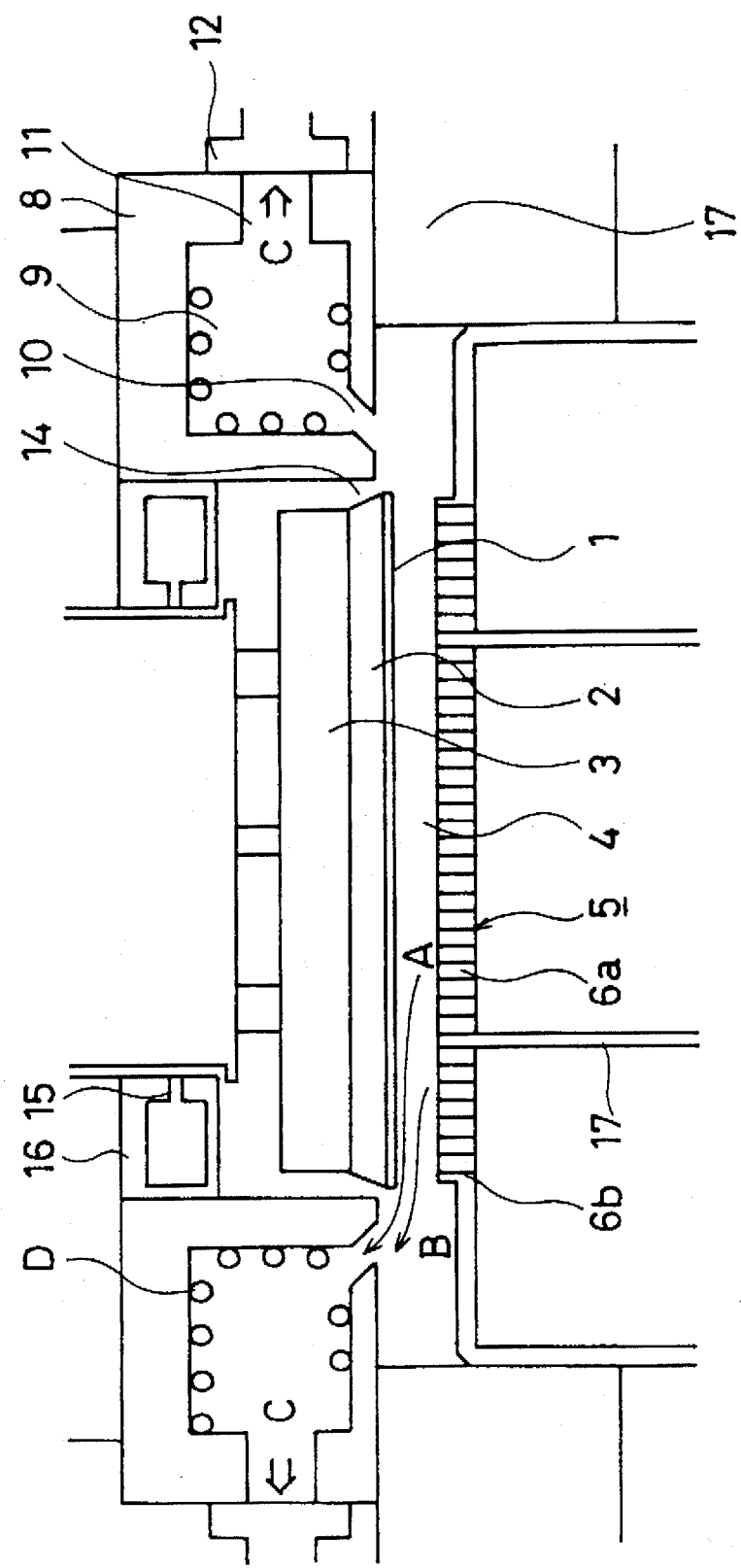
FIG. 4 is a sectional view of a CVD apparatus according to a first embodiment of the present invention.
Figure 5:
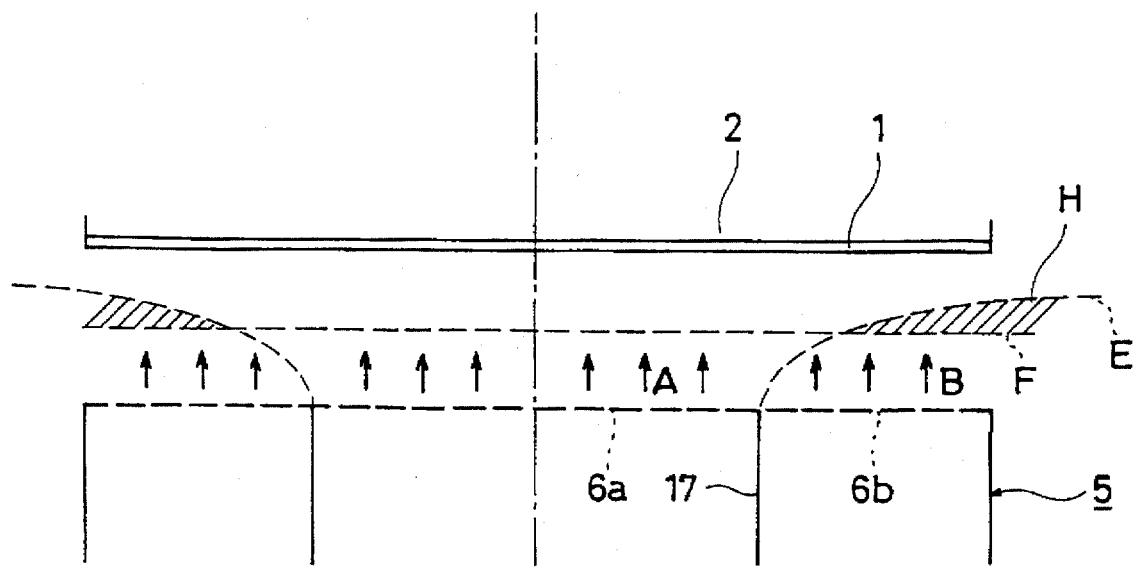
FIG. 5 is an enlarged partial sectional view of the CVD apparatus of FIG. 4 for showing the gas flow manner within the reaction chamber.

FIG. 4 shows a CVD apparatus according to the first embodiment of the present invention, and the gas flow manner in the proximity of the gas head of the CVD apparatus of FIG. 4 is shown in FIG. 5. The CVD apparatus of the first embodiment is similar to that of FIG. 1, except that gas head 5 is separated into a plurality of gas blowing regions by a partition wall 17. The central first gas blowing region comprises a plurality of gas blowing openings 6a for reaction gas A including, for example, TEOS, $O_3$, and $N_2$. The second gas blowing region surrounding the central first gas blowing region comprises a plurality of blowing openings 6b for inert gas B such as $N_2$. Reaction gas A and inert gas B blown out into the reaction chamber at equal speed form a velocity boundary layer of uniform thickness and a temperature boundary layer within the gas flow, as in the CVD apparatus of FIG. 1 including a single gas blowing region. Referring to FIG. 5, broken line E indicates the boundary line of reaction gas concentration, and broken line F indicates the boundary line of the temperature distribution. Temperature boundary line F indicating the boundary of the temperature required for the activation of TEOS and $O_3$ exists substantially in parallel on the surface of heating stage 2.

The diameter of the central first gas blowing region is adjusted within a range that can obtain a concentration of reaction gas A similar to that of the prior art in the proximity of the surface of wafer 1 without being affected by the inert gas at the periphery part. In the portion above the surface of the periphery part of wafer 1, reaction gas A is diluted with inert gas B to have a lower concentration.

More specifically, in the shaded region H between reaction gas concentration boundary line E and temperature boundary line F in FIG. 5, generation of undesirable precipitated particles D is decreased due to the low concentration of reaction gas even though the temperature of the reaction gas is sufficiently high for reaction.

Figure 6A:
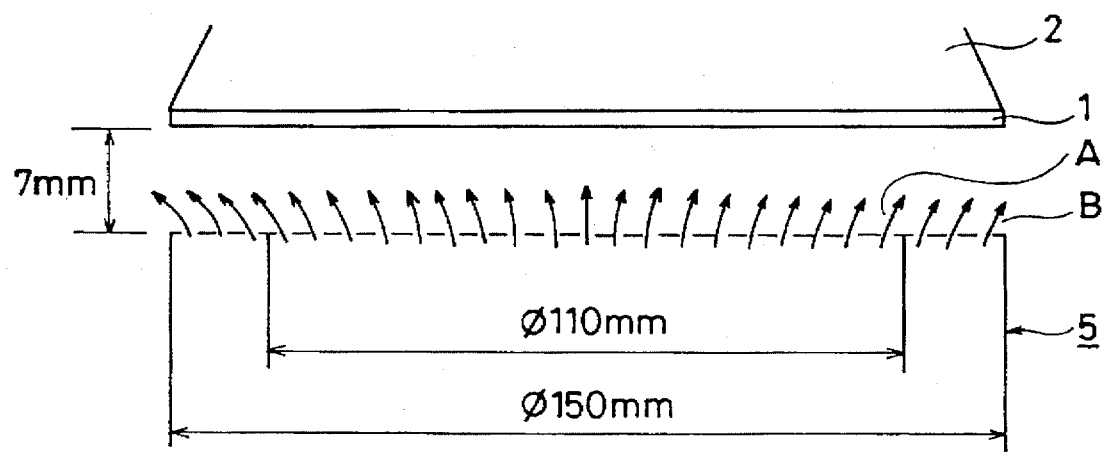
FIG. 6A is a sectional view showing an example of a gas head used in the first embodiment of the present invention.

FIG. 6A shows an example of gas head 5. Gas head 5 has an outer diameter of 150 mm that is equal to that of wafer 1, and the central first gas blowing region that has a diameter of 110 mm. Gas head 5 is provided opposing wafer 1 with a distance of 7 mm therebetween. Reaction gas that is mixed gas of $N_2$, TEOS and $O_3$ and inert gas which is $N_2$ are blown out at an identical flow rate from the central first gas blowing region and the surrounding second gas blowing region, respectively.

The outer diameter of the first reaction gas blowing region is determined by a numerical simulation regarding diffusion of TEOS within gas chamber 4.

Figure 6B:
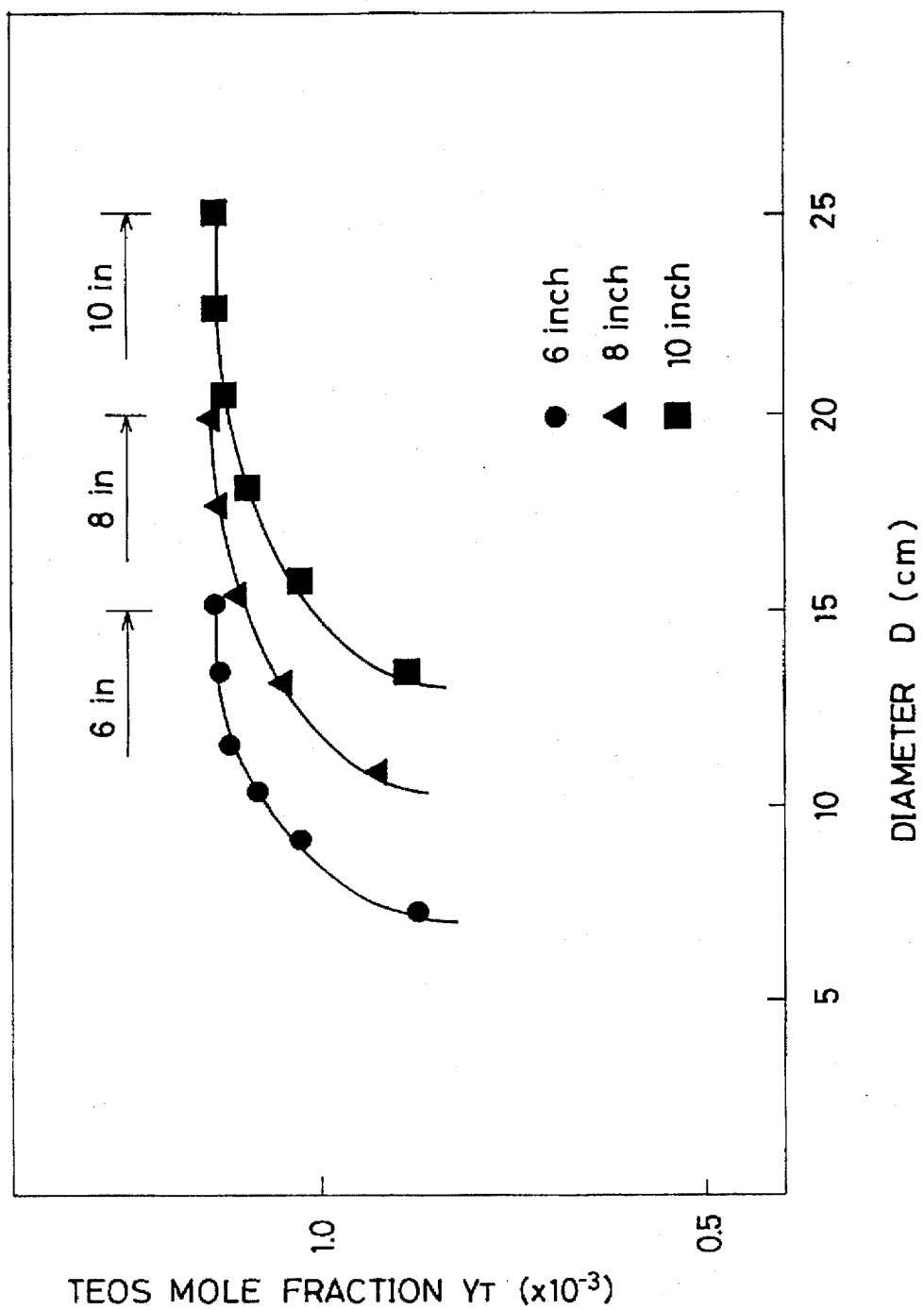
FIG. 6B is a graph showing the relationship between TEOS concentration and diameter D of the first gas blowing region.

FIG. 6B is a graph showing the change in TEOS concentration $Y_T$ in the outer surface of a 6 inch wafer in accordance with the change of the diameter D of the first reaction gas blowing region. It can be appreciated from FIG. 6B that $Y_T$ is constant if D is sufficiently greater than the wafer diameter. However, $Y_T$ decreases suddenly due to dilution by $N_2$ if D becomes smaller. It is to be noted that the decrease of $Y_T$ does not commence just when diameter D becomes smaller than the wafer diameter, and is substantially constant until approximately D=110 mm. It can therefore be understood that the diameter may be reduced up to D=110 mm with respect to a wafer having a diameter of 150 mm to provide reaction gas uniformly to the surface of the wafer.

Figure 7:
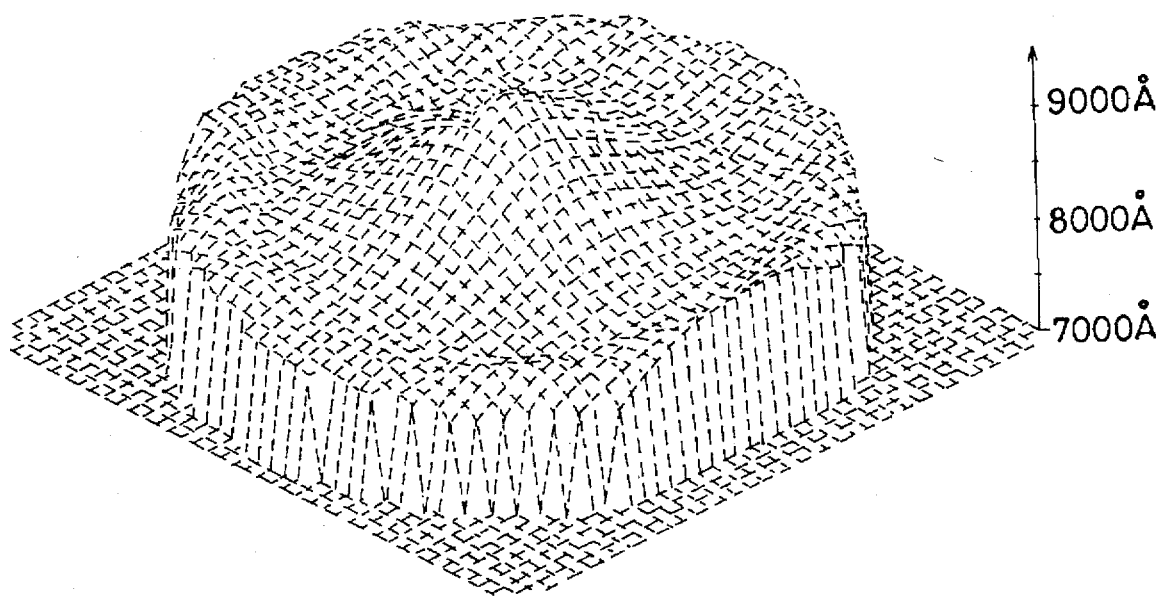
FIG. 7 is a perspective view of a CVD film which is formed using the gas head of FIG. 6, showing an example of film thickness distribution.

FIG. 7 shows the thickness distribution of a CVD ($SiO_2$) film formed by emitting reaction gas A (mixed gas of $N_2$, TEOS and $O_3$) and inert gas B ($N_2$) respectively at an average flow rate of approximately 26 mm/sec. using the gas head of FIG. 6. The vertical axis of FIG. 7 represents the thickness of the $SiO_2$ film. It is appreciated from FIG. 7 that the thickness of the CVD ($SiO_2$) film is substantially equal in above the central and the periphery of wafer 1. Reaction gas A supplied from the central portion of the gas head of FIG. 6 reaches the whole surface of wafer 1.

Figure 8:
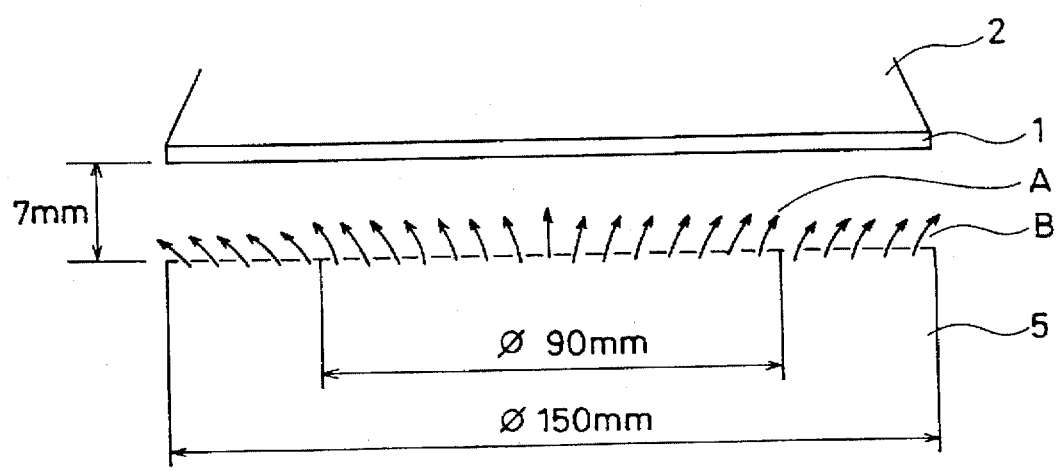
FIG. 8 is a sectional view of another example of a gas head used in the first embodiment of the present invention.

Another example of a gas head is shown in FIG. 8. The gas head of FIG. 8 is similar to that of FIG. 6, except that the diameter of the first gas blowing region is decreased to 90 mm.

Figure 9:
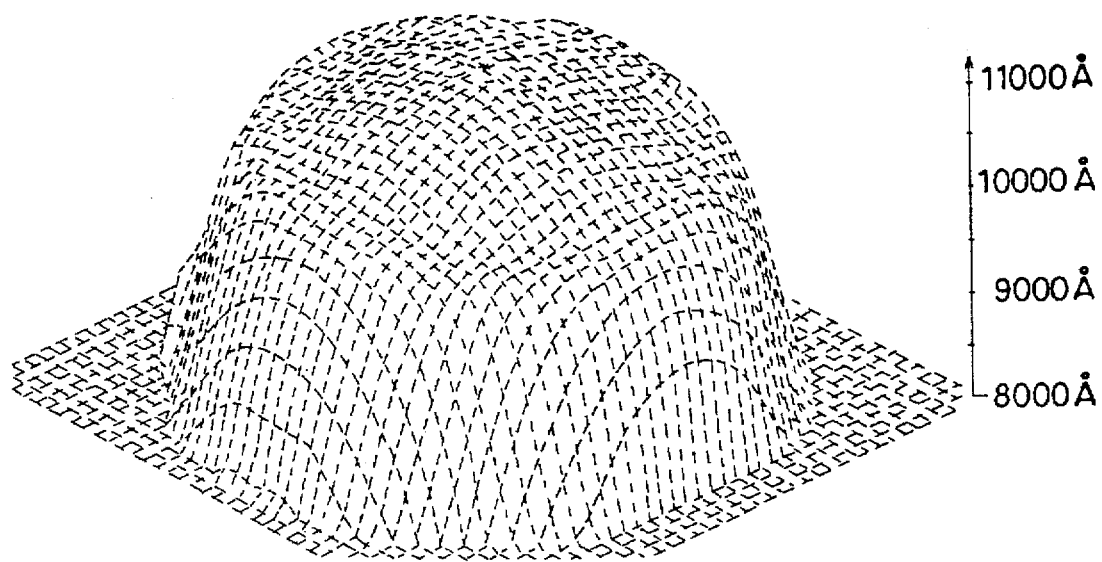
FIG. 9 is a perspective view of a CVD film formed using the gas head of FIG. 8, showing its film thickness distribution.

FIG. 9 shows the thickness distribution of a CVD film ($SiO_2$) formed by emitting reaction gas A (mixed gas of $N_2$, TEOS and $O_3$) and inert gas B ($N_2$) respectively at an average flow rate of approximately 26 mm/sec. using the gas head of FIG. 8. It can be appreciated from FIG. 9 that the thickness of the CVD ($SiO_2$) film is decreased more in the periphery part than in the central part of wafer 1. This means that reaction gas A supplied from the central portion of the gas head of FIG. 8 is diluted with inert gas B in the periphery of wafer 1 so that its concentration is decreased.

It can be appreciated from the above results that the diameter of the central first gas blowing region can be reduced to approximately 110 mm in the case where the outer diameter of wafer 1 is 150 mm and the distance between gas head 5 and wafer 1 is 7 mm. Since the supplying amount of reaction gas A is proportional to the square of the diameter of the first blowing region, the consumed amount of reaction gas A and the amount of the undesirable precipitated particles D can both be reduced in comparison with those in the prior art.

The minimum diameter of the reaction gas blowing region differs according to the size of the opposing wafer, the pressure of reaction chamber 4, the gas flow rate, the type of gas, and the distance between the wafer and the gas head.

According to a simulation of diffusion, it has been identified that the limit for diameter D is approximately 40 mm smaller than the wafer diameter in the case of various wafer diameters under the conditions identical to those of FIG. 6B, as shown in the following Table 1.

TABLE.1

| Wafer Diameter | 6 (in.) (150 mm) | 8 (in.) (200 mm) | 10 (in.) (250 mm) |
|---|---|---|---|
| D | 110 mm | 160 mm | 210 mm |

The minimum diameter varies according to the pressure of reaction chamber 4, the gas flow rate, the type of gas, and the distance between the wafer and the gas head. The diameter increases in proportion to the decrease of pressure, decreases in proportion to the increase of flow rate, decreases in proportion to the decrease of the gas diffusion coefficient, and increases in proportion to the increase in the distance between the wafer and the gas head.

Figure 10:
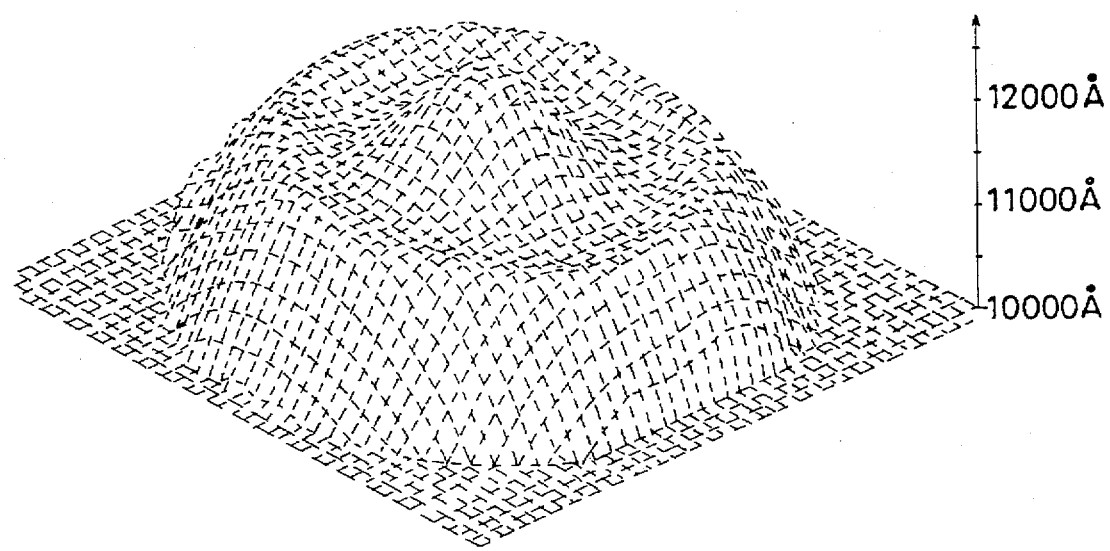
FIG. 10 is a perspective view of a CVD film formed using the gas head of FIG. 6, showing a further example of its film thickness distribution.

FIG. 10 shows the thickness distribution of a CVD film formed by reaction gas A (mixed gas of $N_2$, TEOS and $O_3$) emitted from the first gas ($N_2$) blowing region and inert gas B emitted from the second gas blowing region at an average velocity ratio of 1:0.77 using the gas head of FIG. 6. It can be appreciated from FIG. 10 that the periphery part of the CVD film is thinner than the central portion. This is considered to be caused by decrease in concentration of reaction gas A having a low bias towards wafer 1 by inert gas B in the proximity of the peripheral part of wafer 1, since the flow rate of inert gas B supplied from the peripheral part of gas head 5 is lower than that of reaction gas A supplied from the central part.

Figure 11:
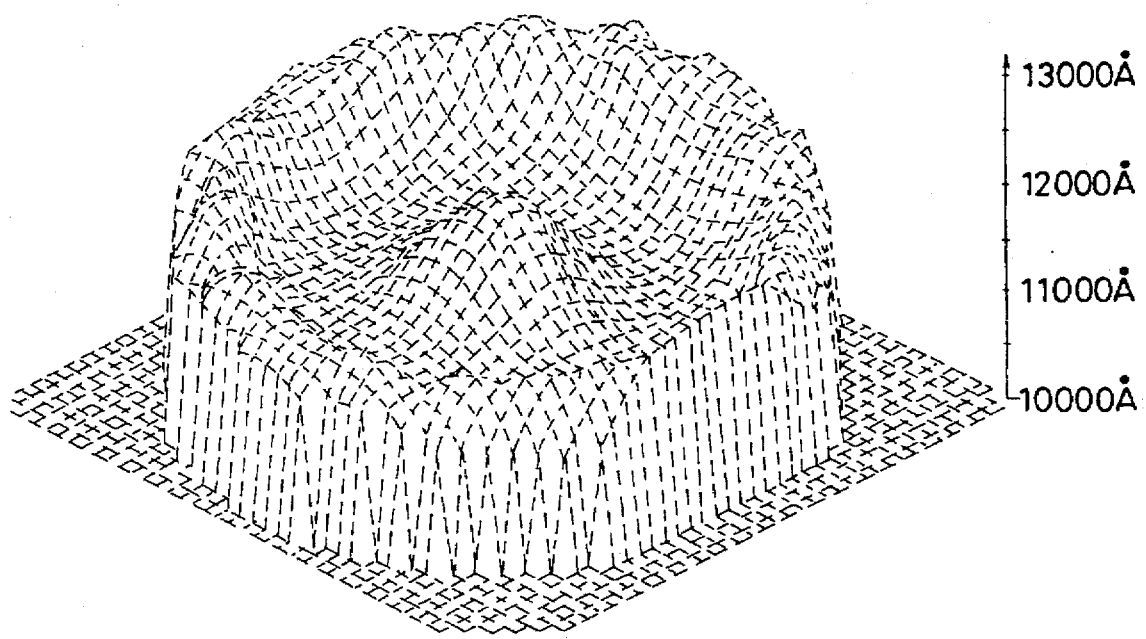
FIG. 11 is a perspective view of a CVD film formed using the gas head of FIG. 6, showing a still further example of its film thickness distribution.

FIG. 11 shows the thickness distribution of a CVD ($SiO_2$) film formed by reaction gas A (mixed gas of $N_2$, TEOS and $O_3$) emitted from the first gas blowing region and inert gas B ($N_2$) emitted from the second gas blowing region at an average velocity ratio of 1:1.19 using the gas head of FIG. 6. The thickness of the CVD film is increased in the peripheral part than in the central part of wafer 1. This is considered to be caused by increase in concentration of reaction gas A receiving bias towards wafer 1 by inert gas B, since the flow rate of inert gas B supplied from the peripheral part of gas head 5 is greater than that of reaction gas A provided from the middle.

It can be understood from FIGS. 10 and 11 that the film thickness distribution of the CVD film formed on wafer 1 may be controlled by varying the average flow rate of inert gas B emitted from the second blowing region of the peripheral part of gas head 5 with respect to the average flow rate of reaction gas A emitted from the first gas blowing region of the central of gas head 5. Therefore, if the film thickness of the CVD film formed on wafer 1 is not radially uniform by some reason, the thickness distribution of the CVD film can be made uniform by changing the film thickness to eliminate nonuniformity of the CVD film by altering the flow rate of inert gas B supplied from the second gas blowing region of the periphery of gas head 5.

Figure 12:
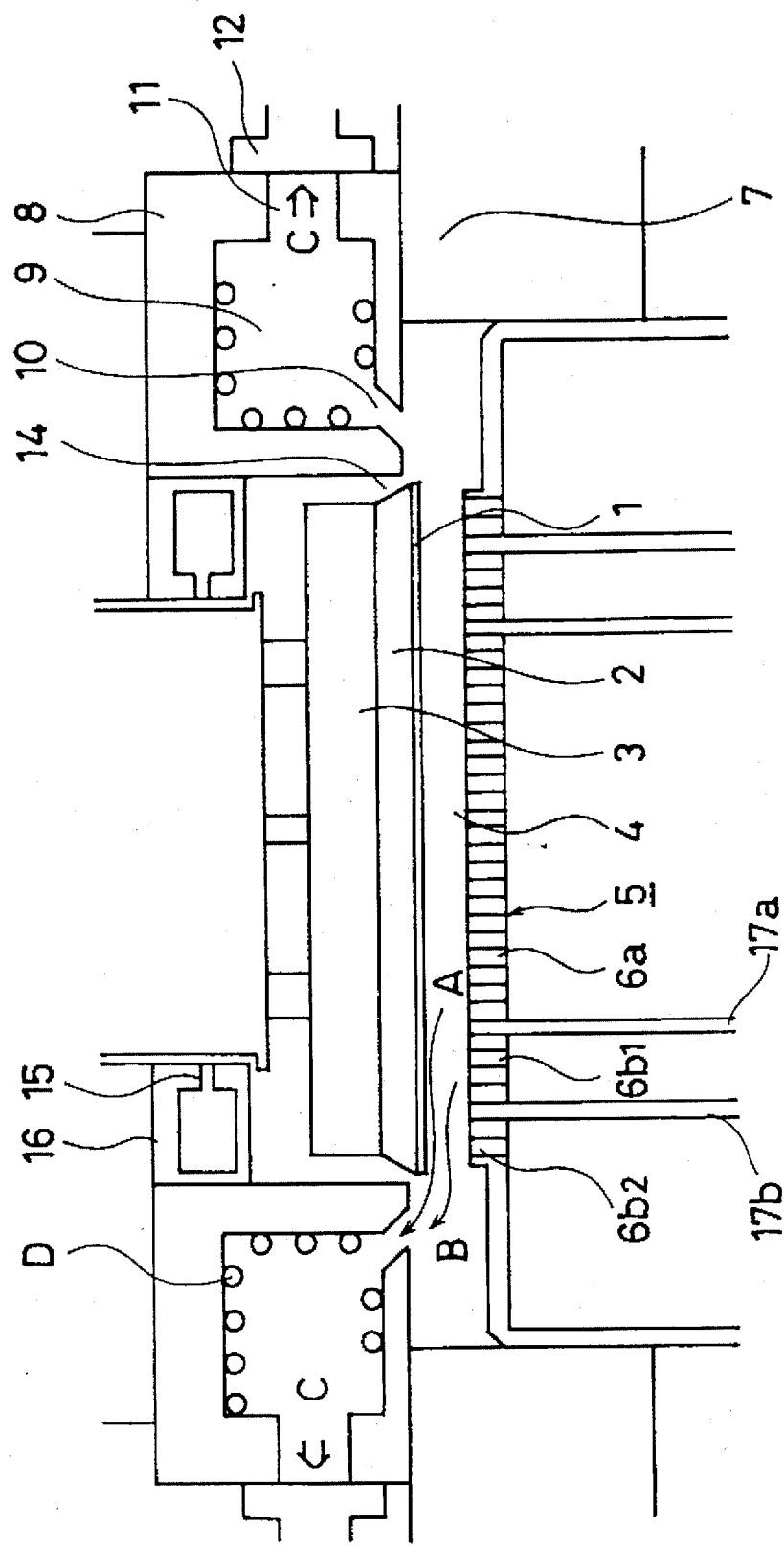
FIG. 12 is a sectional view of a CVD apparatus according to a second embodiment of the present invention.

FIG. 12 shows a CVD apparatus according to a second embodiment of the present invention. The CVD apparatus of FIG. 12 is similar to that of FIG. 4, except that gas head 5 is modified. Gas head 5 of FIG. 12 comprises, in addition to the central first gas blowing region including blowing openings 6a for reaction gas A and the second gas blowing region including blowing openings 6b1 for inert gas B surrounding the first gas blowing region, a third gas blowing region surrounding the second gas blowing region including blowing openings 6b2 for inert gas B. The first, second and third gas blowing regions are separated from each other by two partition walls 17a and 17b.

If the first gas blowing region has a diameter of 90 mm, the second gas blowing region an outer diameter of 120 mm, and the third gas blowing region an outer diameter of 150 mm, and the average gas flow rate emitted from blowing openings 6a, 6b1, and 6b2 is the same approximately 26 mm/sec., the thickness of the CVD film decreases in the periphery part of wafer 1 as in FIG. 9. If the flow rate of the gases emitted from blowing openings 6a, 6b1, and 6b2 are set to a flow rate ratio of 1:1:1.2, a CVD film of relatively uniform thickness is formed. This is because inert gas B supplied from blowing openings 6b2 biases reaction gas A towards wafer 1 in the periphery region of wafer 1 to increase the concentration of reaction gas A in the proximity of the periphery of wafer 1.

According to the second embodiment, it is possible to further reduce the diameter of the first gas blowing region for reaction gas A than that of the first embodiment. This means that the supplied amount of reaction gas and the amount of the undesirable precipitated particles D are further reduced.

Figure 13:
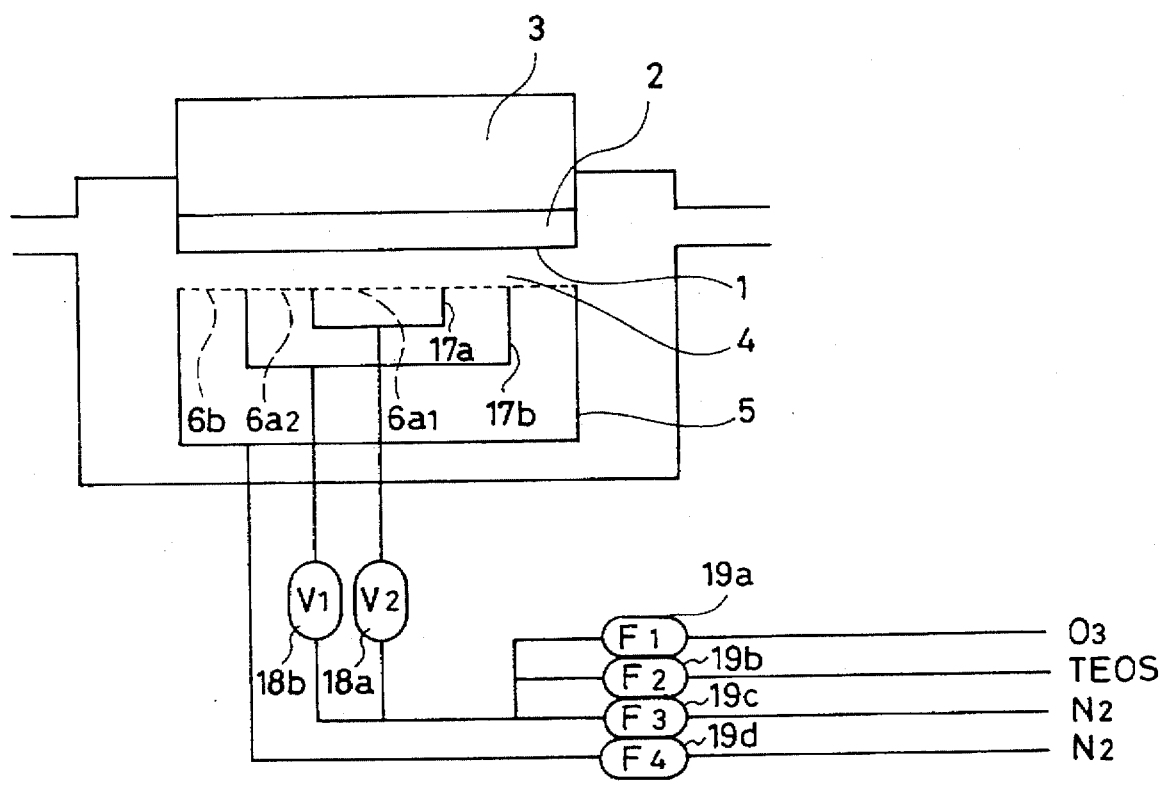
FIG. 13 is a diagram schematically showing a CVD apparatus according to a third embodiment of the present invention.

FIG. 13 schematically shows a third embodiment of the present invention. The apparatus of the third embodiment has the first and second gas blowing regions 6a1 and 6a2 separated by a first partition 17a, and the second and third gas blowing regions 6a2 and 6b separated by a second partition 17b. $O_3$, TEOS, and $N_2$ are supplied via mass flow controllers 19a, 19b and 19c and a valve 18a to the first gas blowing region 6a1. Similarly, $O_3$, TEOS, and $N_2$ are supplied via mass flow controllers 19a, 19b, and 19c and a valve 18b to the second gas blowing region 6a2. Inert gas $N_2$ is provided to the third gas blowing region 6b via a mass controller 19d. The third embodiment allows a more accurate control of the concentration of the reaction gas and the relative flow rates of the reaction gas and the inert gas in comparison with the first and second embodiments to obtain a CVD film of a further uniform thickness.

Figure 14:
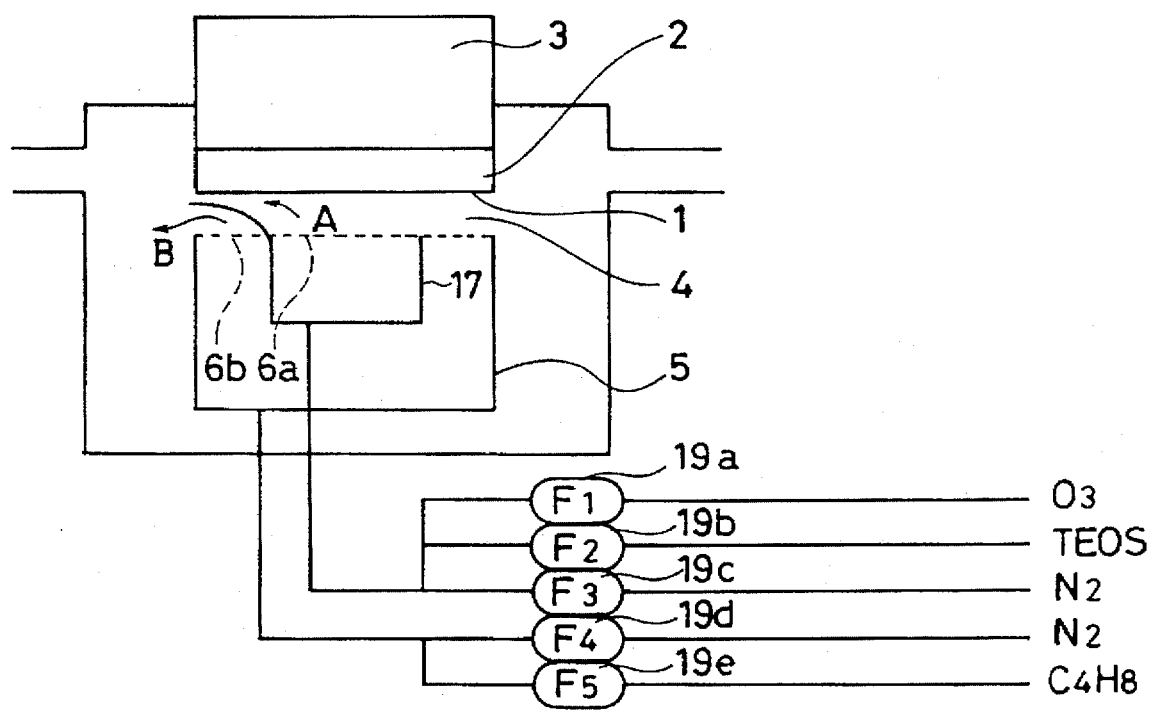
FIG. 14 is a diagram schematically showing a CVD apparatus according to a fourth embodiment of the present invention.

FIG. 14 schematically shows a fourth embodiment of the present invention. The fourth embodiment is a modification of the first embodiment, with $O_3$, TEOS, and $N_2$ supplied to the first gas flow region 6a via mass flow controllers 19a, 19b, and 19c, and $N_2$, $C_4H_8$ (isobutene) supplied to second gas blowing region 6b via mass controllers 19d and 19e. Since $C_4H_8$ is highly reactive with the oxygen atoms generated by thermal decomposition of $O_3$, the reaction of the oxygen atoms and TEOS can be suppressed to efficiently decrease the amount of the undesirable precipitated particles D.

Although $C_4H_8$ is described as the gas for suppressing the amount of the undesirable precipitated particles D, other gases that efficiently capture oxygen atoms may be used. For example, hydrocarbon gas such as $C_2H_4$, $C_3H_6$ and alcohol gas such as methanol and ethanol may be used.

Figure 2:
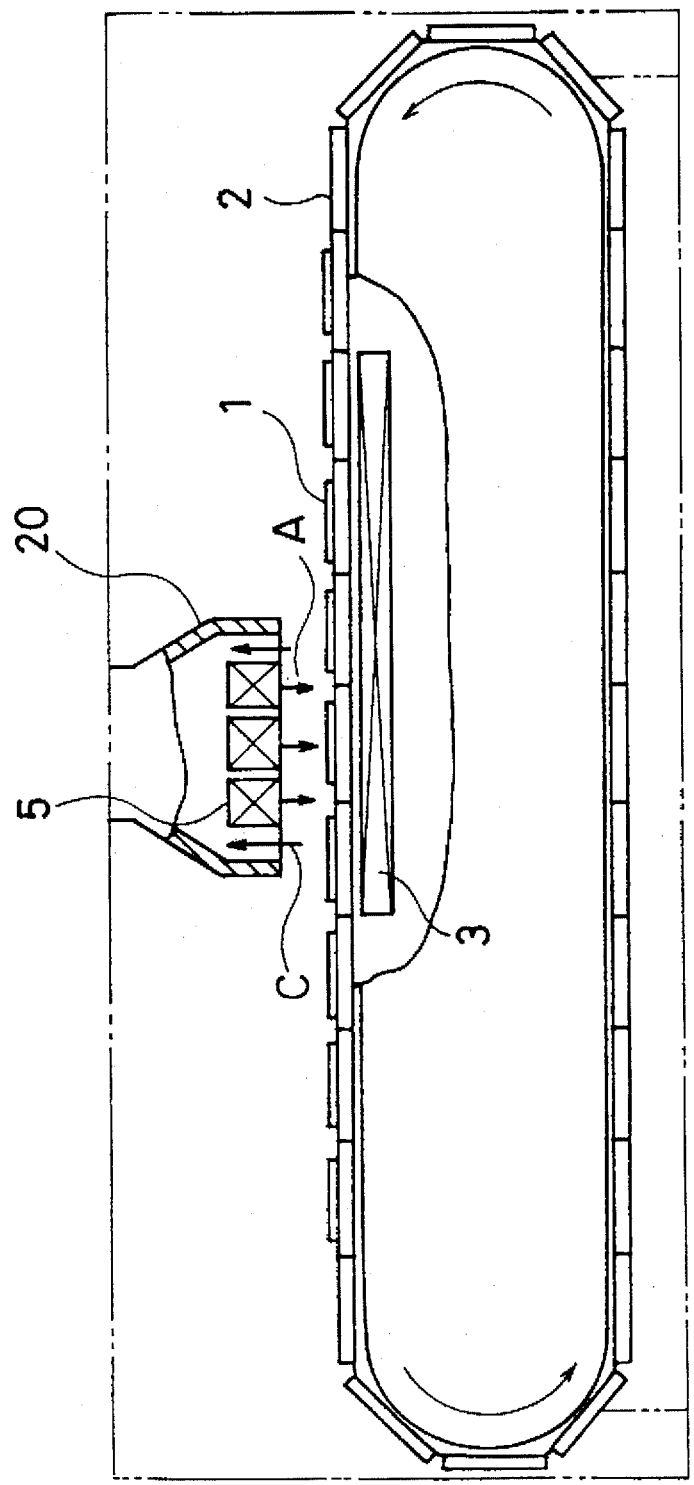
FIG. 2 is a side view of the major components of a conventional continuous type CVD apparatus with some parts cut off.
Figure 3:
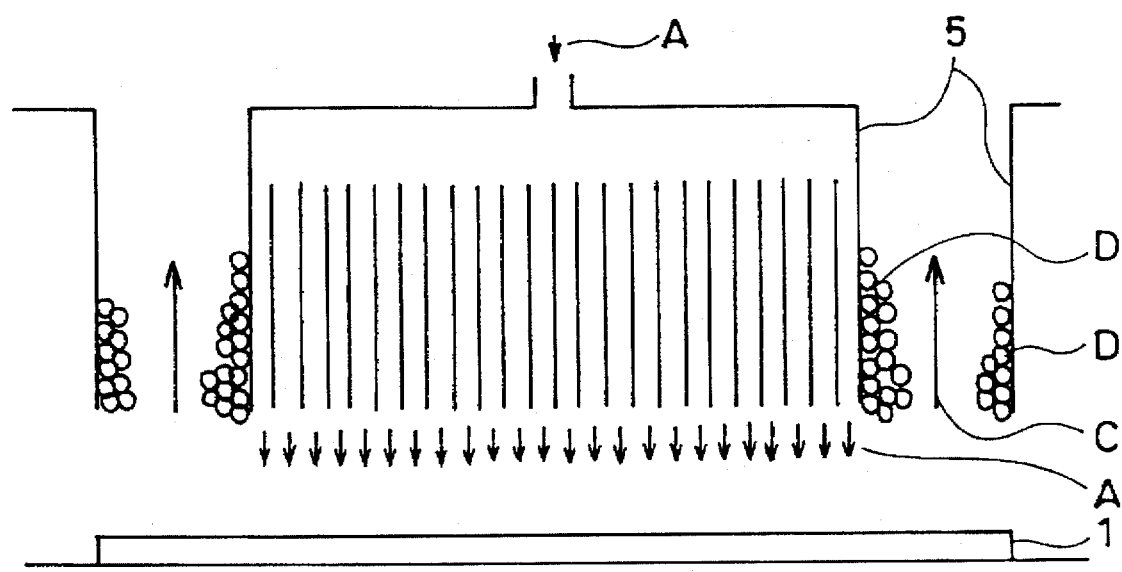
FIG. 3 is an enlarged sectional view of the gas head portion of the continuous type CVD apparatus of FIG. 2.
Figure 15A:
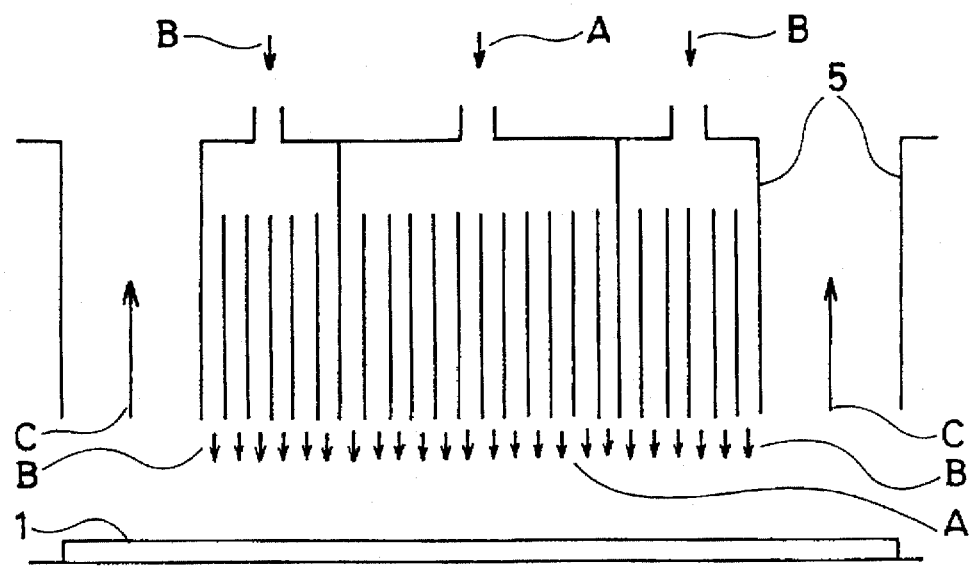
FIG. 15A is a sectional view schematically showing the gas head in a CVD apparatus according to a fifth embodiment of the present invention.
Figure 15B:
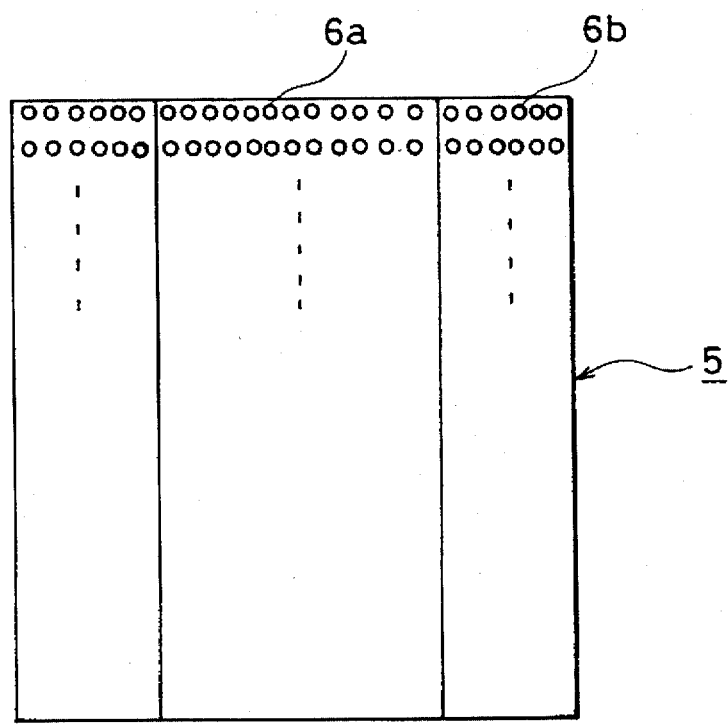
FIG. 15B is a bottom plan view schematically showing the gas head of FIG. 15A.

The gas head of a fifth embodiment of the present invention has its sectional view schematically shown in FIG. 15A and its bottom plan view schematically shown in FIG. 15B. This gas head is used in a continuous type CVD apparatus similar to that of FIG. 2, and comprises a central first blowing region 6a for reaction gas A and a second gas blowing region 6b provided on both sides of first blowing region 6a for inert gas B. In this case, reaction gas A supplied from the central portion 6a of gas head 5 reaches wafer 1 to form a CVD film. Inert gas B is emitted from both side regions 6b of gas head 5 at a flow rate equal to that of reaction gas A. Accordingly, inert gas B spreads out horizontally without disturbing the flow of reaction gas A to be exhausted without reaching wafer 1.

Because the portion of reaction gas A supplied from gas head 5 that is exhausted without reaching semiconductor wafer 1 will be replaced with inert gas B in the fifth embodiment, the undesirable event where precipitated particles D generated by reaction gas A-not reaching wafer 1 and adhering to the outside wall of gas head 5 and the inside wall of exhaust cover 20 will not be encountered. Therefore, the product yield and operating efficiency of the apparatus can be improved. Furthermore, the amount of reaction gas A used can be saved since the necessary supplied amount of reaction gas A decreases in proportion to the decrease of the area of the first gas blowing region.

Although $TEOS-O_3$ is taken as an example of reaction gas in the above embodiments, it will be understood by those skilled in the art that the present invention is preferably applicable to CVD generating undesirable precipitated particles using other reaction gases. The inert gas is not limited to $N_2$, and He, Ar and the like may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A CVD apparatus comprising:
   a CVD reaction chamber,
   a circular-shaped heating stage for holding a substantially circular semiconductor wafer set thereupon at a predetermined temperature in said reaction chamber, said semiconductor wafer having opposing surfaces, each opposing surface including a peripheral surface, said circular-shaped heating stage having a specified diameter,
   an exhaust port surrounding said heating stage being outward of an edge of said wafer,
   a CVD reaction gas source and an inert gas source, said inert gas source supplying only inert gas,
   a gas head provided opposing said wafer for emitting gas towards said wafer, said gas head including a first gas blowing region in communication with said CVD reaction gas source for emitting CVD reaction gas towards at least a central major region of said wafer, said first gas blowing region being substantially circular in shape and having a diameter smaller than a diameter of said substantially circular semiconductor wafer, and a second gas blowing region in sole communication with said inert gas source, said second gas blowing region including an annular plate, the plate having gas blowing openings densely arranged therein, the second gas blowing region surrounding the periphery of said first gas blowing region and being sized with respect to the diameter of the wafer so that the gas blowing openings of said second gas blowing region perpendicularly face one of the peripheral surfaces of said wafer so that inert gas is directed to said one of the peripheral surfaces of the wafer, said first gas blowing region including a circular plate having gas blowing openings therein, the gas blowing openings densely arranged over substantially the entire circular plate such that said CVD reaction gas flows from said gas blowing openings toward said semiconductor wafer and radially outwardly toward said exhaust port, said first and second gas blowing openings being in a common plane apart from said wafer by a predetermined distance such that a face plane of the gas head is substantially parallel to a surface of the wafer and wherein the diameter of sad first gas blowing region is less than the diameter of said circular-shaped heating stage and said first gas blowing region is separated from the second gas blowing region by a thin wall, whereby a CVD film of high quality can be formed in uniform thickness of said wafer, and the consumed amount of reaction gas and the amount of the undesirable precipitated particles can be reduced.

2. The CVD apparatus according to claim 1, wherein said reaction gas and said inert gas are emitted from said first and second gas blowing regions, respectively, at equal velocity.

3. The apparatus according to claim 1, wherein said second gas blowing region is divided into first and second subregions concentric with each other, wherein the velocity of inert gas emitted from the outer second subregion is greater than that of inert gas emitted from the inner first subregion.

4. The apparatus according to claim 1, wherein said first gas blowing region is divided into first and second subregions concentric with each other,
   wherein reaction gas is emitted respectively from said first and second subregions at equal velocities.

5. The CVD apparatus according claim 1, wherein said inert gas is selected from the group consisting of nitrogen, helium, and argon.

6. The CVD apparatus of claim 1 wherein said circular-shaped heating stage faces at least a portion of said second gas blowing region.

7. The CVD apparatus of claim 1 wherein said first gas blowing region is at least 40 mm less than the diameter of said circular-shaped heating stage.

8. The CVD apparatus of claim 1 wherein said CVD reaction chamber maintains a pressure therein within a range of 100 Torr to atmospheric pressure.

* * * * *